(12) United States Patent
Benzer

(10) Patent No.: US 9,391,618 B2
(45) Date of Patent: Jul. 12, 2016

(54) HIGH VOLTAGE FAIL-SAFE IO DESIGN USING THIN OXIDE DEVICES

(71) Applicant: BROADCOM CORPORATION, Irvine, CA (US)

(72) Inventor: Darrin Robert Benzer, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 68 days.

(21) Appl. No.: 14/472,283

(22) Filed: Aug. 28, 2014

(65) Prior Publication Data

US 2016/0043719 A1 Feb. 11, 2016

Related U.S. Application Data

(60) Provisional application No. 62/034,107, filed on Aug. 6, 2014.

(51) Int. Cl.
*H03K 19/007* (2006.01)
*H03K 19/003* (2006.01)
*H03K 5/08* (2006.01)

(52) U.S. Cl.
CPC ............... *H03K 19/007* (2013.01); *H03K 5/08* (2013.01); *H03K 19/003* (2013.01)

(58) Field of Classification Search
USPC ..................................... 326/37–49
See application file for complete search history.

(56) References Cited

U.S. PATENT DOCUMENTS

| | | | | |
|---|---|---|---|---|
| 5,448,198 | A * | 9/1995 | Toyoshima | ......... H01L 27/0218 257/E27.11 |
| 6,414,515 | B1 * | 7/2002 | Kunz | ............... H03K 19/00315 326/81 |
| 7,521,965 | B2 * | 4/2009 | Oertle | .............. H03K 19/00315 326/81 |
| 2011/0102045 | A1 * | 5/2011 | Kumar | ................. H03K 17/693 327/306 |

* cited by examiner

*Primary Examiner* — Douglas W Owens
*Assistant Examiner* — James H Cho
(74) *Attorney, Agent, or Firm* — McDermott Will & Emery LLP

(57) ABSTRACT

A high-voltage fail-safe input/output (I/O) interface circuit includes a voltage-divider circuit coupled to an I/O pad of the I/O interface circuit, and a selector circuit configured to couple, to a power supply line of the I/O interface circuit one of an output of the voltage-divider circuit or and I/O supply voltage. The voltage-divider circuit and the selector circuit are implemented on the same chip with the I/O interface circuit.

20 Claims, 5 Drawing Sheets

HIGH VOLTAGE FAIL-SAFE IO DESIGN USING THIN OXIDE DEVICES

CROSS-REFERENCE TO RELATED APPLICATIONS

This application claims the benefit of priority under 35 U.S.C. §119 from U.S. Provisional Patent Application 62/034,107 filed Aug. 6, 2014, which is incorporated herein by reference in its entirety.

TECHNICAL FIELD

The present description relates generally to Input/output (I/O) circuits, and more particularly, but not exclusively, to high voltage fail-safe I/O design using thin oxide devices.

BACKGROUND

An input/output (I/O) interface circuit is provided in conjunction with each I/O pad of many semiconductor chips, for example, to drive an external circuit connected to the I/O pad or to buffer signals received from the external circuit. The I/O interface circuit can become damaged when one or more power supplies of the I/O interface circuit are not available, while the I/O pad is connected to a live signal. Reliability issues can also arise during power-up sequencing. For instance, the I/O interface circuit can become damaged during specific power supply sequences, such as powering up the chip before or after an external signal is applied to the I/O pad.

Existing solutions provide external fault protection switches that isolate the input signal from the I/O pad, which allows the input signals to be present before the power supplies of the I/O interface circuit are available. These solutions, while may work for their intended purposes, not only add to the cost and board complexity, but can adversely affect the performance of the I/O interface circuit. Further, the existing solutions require the use of high voltage (e.g., thick-oxide) devices.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In one or more aspects, methods and implementations for providing a high-voltage fail-safe input/output (I/O) interface circuit are disclosed. The subject technology includes a number of advantageous features at circuit, system, and product levels. At the circuit level the disclosed solution eliminates reliability issues due to device overstress during a fail-safe condition (e.g., one or more of the I/O power supplies is not available while an input signal is present at the I/O pad), avoids the requirement of external board components to protect against the device overstress during the fail-safe condition, and eliminates the need for special power sequencing requirements of the power supplies. The system advantages include avoiding extra board components, which reduces the overall system cost, and eliminating the need for special power sequencing requirements of the power supplies. At the product level, the subject technology allows more flexibility with various I/O interfaces, that can normally be limited due to overstress and reliability concerns, and reduces the product cost.

Figure 1A:
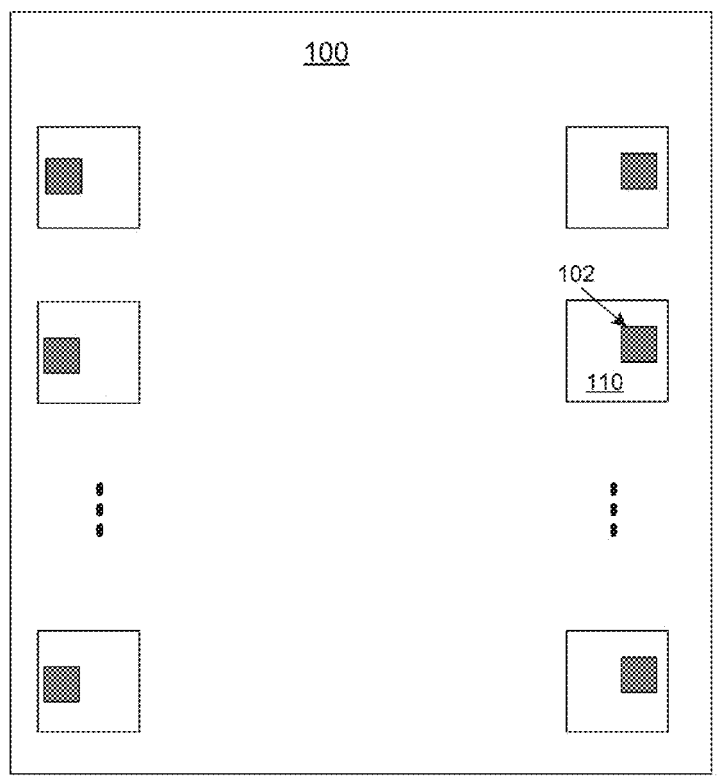
FIG. 1A illustrates an example of a chip including one or more high-voltage fail-safe input/output (I/O) interface circuits in accordance with one or more implementations.

FIG. 1A illustrates an example of a chip 100 including one or more high-voltage fail-safe input/output (I/O) interface circuits 110 in accordance with one or more implementations of the subject technology. The chip 100 includes various circuits and can be coupled to other chips or circuits via a number of I/O pads 102. An I/O interface circuit 110 is associated with each I/O pad 102. The I/O interface circuit 110 includes one or more driver circuits that can drive one or more external circuits or devices coupled to the respective I/O pad 102. The I/O interface circuit 110 further includes buffer circuits that can condition the signals received from the external circuits or devices for further processing by various circuits on the chip. The subject technology provides a high-voltage fail-safe I/O interface circuit, as discussed in more detail herein.

Figure 1B:
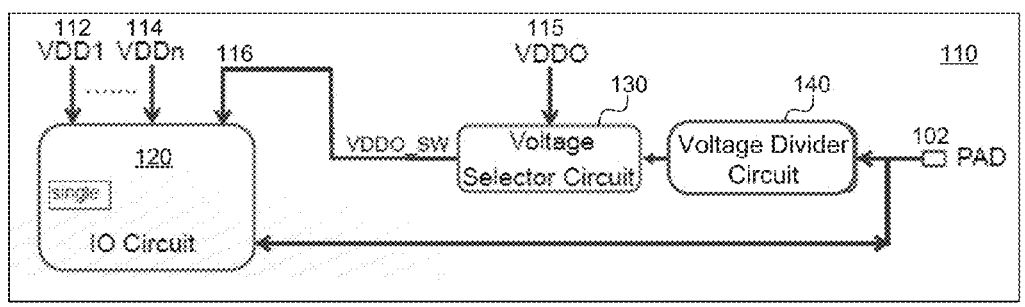
FIG. 1B illustrates an example of a high-voltage fail-safe I/O interface circuit in accordance with one or more implementations.

FIG. 1B illustrates an example of a high-voltage fail-safe I/O interface circuit 110 in accordance with one or more implementations of the subject technology. The high-voltage fail-safe I/O interface circuit 110 includes an I/O circuit 120, a selector circuit (e.g., a voltage selector circuit) 130, and a voltage-divider circuit 140. The I/O circuit 120 includes one or more driver circuits and buffer circuits as described above, but is not limited to these circuits. The I/O circuit can be powered by a number of chip power sources such as a low-voltage core supply 112 (e.g., VDD1), one or more intermediate voltage supplies 114 (e.g., VDDn), and a high-voltage power supply line 116 (e.g., switch VDD0, designated as VDD0_SW).

In some implementations, the intermediate voltage supply 114 has a voltage level between the voltage levels of the core voltage supply 112 and the power supply line 116 and is generated (e.g., derived from) by the power supply line 116. In some implementations, the voltage levels of the core voltage supply 112 and the power supply line 116 are, for example, approximately 1.0V and 3.3V, respectively. The 1.8V intermediate voltage supply 114 can be safely applied to 1.8V thin-oxide devices (e.g., MOS devices). Further, when, the I/O supply voltage 115 is ~3.3V and is connected to a source node of a PMOS transistor, the gate node of the transistor can be switched safely between 3.3V end the intermediate voltage supply 114 (e.g., 1.8V).

In one or more implementations, the voltage-divider circuit 140 is coupled to an I/O pad 102 of the I/O interface circuit 110. The selector circuit 130 couples, one of an output of the voltage-divider circuit 140 or an I/O supply voltage 115 (e.g., VDDO ~3.3V) to a power supply line 116 of the I/O circuit 120. As a beneficial feature of the subject technology, the voltage-divider circuit 140 and the selector circuit 130 are implemented on the same chip 110 with the I/O interface circuit 120, while the existing solutions use external switches to provide the high-voltage fail-safe feature. The selector circuit 130 allows for high-voltage fail-safe operation of the I/O interface circuit 110, when a supply voltage such as the I/O supply voltage 115 is not available and an input signal (e.g., a pad voltage) is being applied to the I/O pad 102. In other words, during the high-voltage fail-safe mode of operation, the selector circuit 130 couples a percentage (e.g., defined by the voltage-divider circuit 140) of the input signal to the power supply line 116 of the I/O circuit 120 to replace the missing voltage of the unavailable I/O supply voltage 115.

Figure 2A:
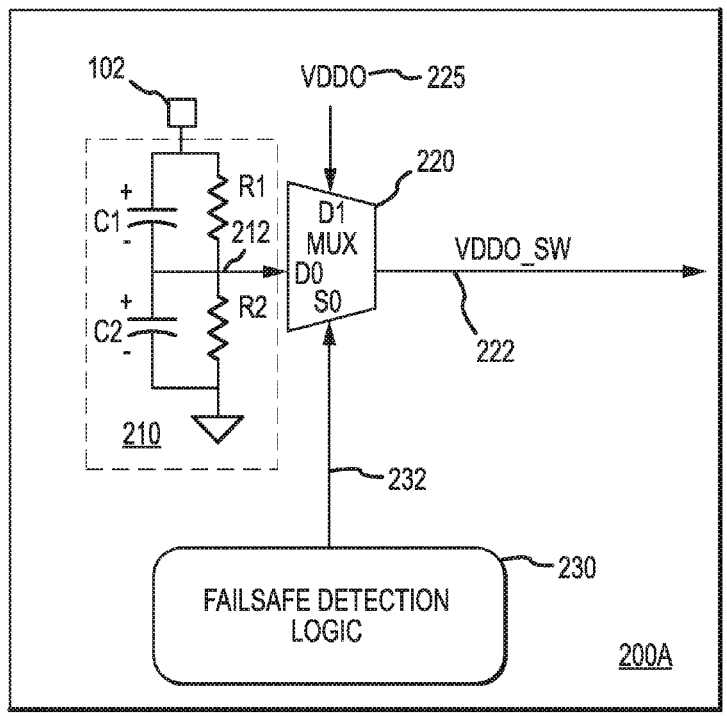
FIGS. 2A through 2C illustrate examples of a high-voltage fail-safe I/O interface circuit in accordance with one or more implementations.
Figure 2B:
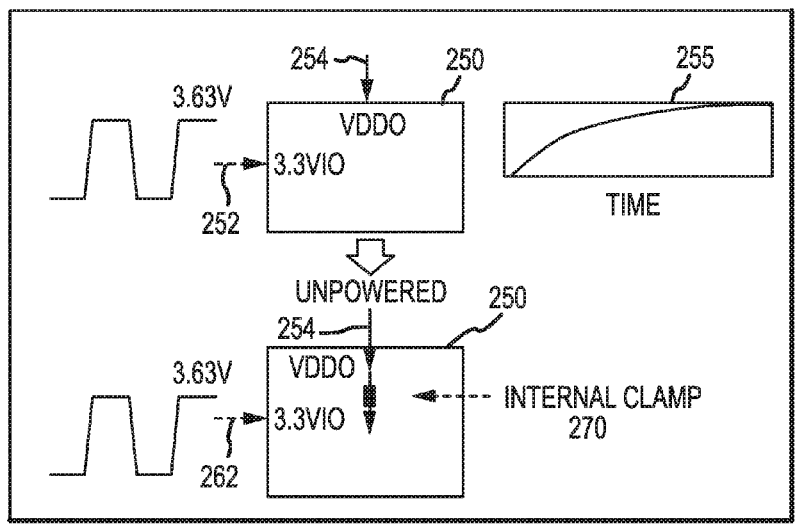
Figure 2C:
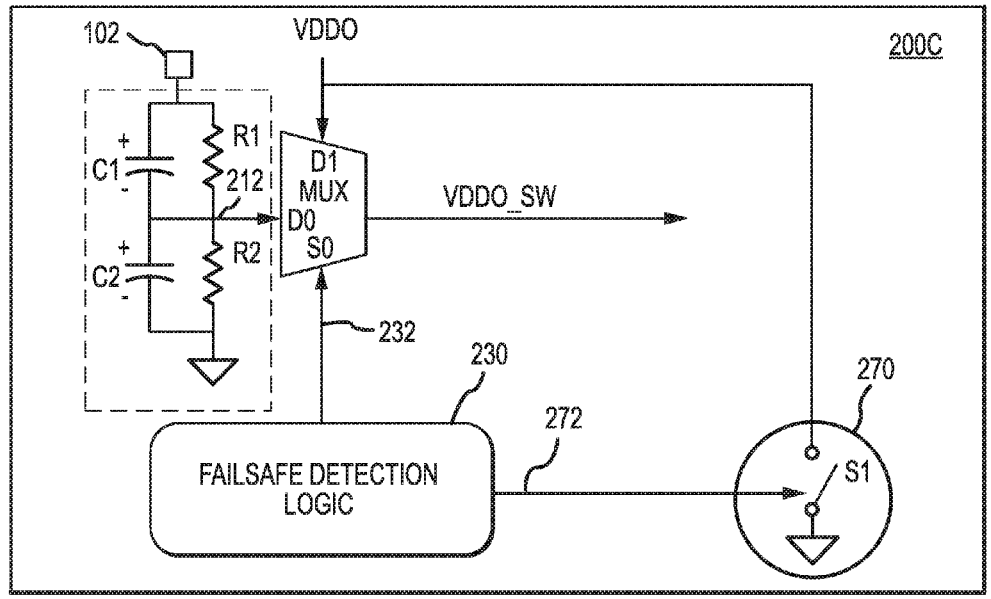

FIGS. 2A through 2C illustrate examples of a high-voltage fail-safe I/O interface circuit in accordance with one or more implementations of the subject technology. The high-voltage fail-safe I/O interface circuit 200A (hereinafter, "I/O interface circuit 200A") includes voltage-divider circuit 210, a selector circuit 220, and a fail-safe detection logic circuit 230. The voltage-divider circuit 210 and the selector circuit 220 (e.g., a multiplexer (MUX)) are example implementations of the voltage-divider circuit 140 and the selector circuit 130 of FIG. 1B. In some implementations, the voltage-divider circuit 140 and the selector circuit 130 can be implemented differently than the voltage-divider circuit 210 and the selector circuit 220. During the high-voltage fail-safe mode of operation, the I/O interface circuit 200A supplies power (e.g., through supply line 222) to the I/O circuit 120 of FIG. 1B to prevent overvoltage stresses on I/O circuit 120.

The voltage-divider circuit 210 includes voltage-divider resistors R1 and R2 and voltage-divider capacitors C1 and C2 (e.g., bypass capacitors for high frequency signals). In some implementations, the voltage-divider circuit 210 can provide, at an output node 212, a programmable percentage (e.g., a fraction) of the magnitude of the input signal applied to the I/O pad 102 to the input node D0 of the MUX 220. For example, the voltage-divider circuit 210 provides 50% of the input signal voltage (e.g., ~3.3V, which cannot be applied to thin-oxide devices due to overvoltage stress) to the input node D0 of the MUX 220. In some implementations, the MUX 220 selects one of an output of the voltage-divider circuit 210 or the I/O supply voltage 225, connected to a node D1 of the MUX 220, based on a fail-safe detection signal 232 received at a node S0 of the MUX 220. In some aspects, the fail-safe detection logic circuit 230 generates the fail-safe detection signal 232 when the I/O supply voltage 225 is not available and the input signal is applied to the I/O pad 102. In one or more implementations, the fail-safe detection logic circuit 230 can be realized by a transistor circuit known to a person of ordinary skill in the art, such that when the I/O supply voltage 115 is not available (e.g., ~0V) and the input signal at the pad 102 is ~3.3V, generates a signal (e.g., fail-safe detection signal 232) that can select the proper voltage to be applied to the supply line 222.

As shown in FIG. 2B, the fail-safe input signal can charge up an unpowered I/O supply voltage line 254 of an I/O interface circuit 250, as indicated by the voltage-versus-time plot 255. In one or more implementations, the fail-safe I/O interface circuit 250 includes an internal clamp circuit 270 that prevents overvoltage stresses on the I/O interface circuit 250 by clamping the I/O power supply voltage line 254 to a low voltage (e.g., ground potential), during a fail-safe mode of operation.

In one or more implementations, the internal clamp circuit 270 can be realized by using a switch S1, as shown in FIG. 2C. The structure and functionalities of the I/O interface circuit 200C is similar to the I/O interlace circuit 200A, except for addition of the internal clamp circuit 270. In some aspects, the switch S1 is controlled by a fail-safe detection signal 272 generated by the fail-safe detection logic circuit 230. The switch S1 is enabled (e.g., closed) during the fail-safe mode of operation of the I/O interface circuit 200C, which provides a low impedance path between the VDDO and ground. The switch S1 prevents the unpowered VDDO supply from charging up during the fail-safe mode of operation. In some aspects, the fail-safe detection signal 272 enables the switch S1 to prevent VDDO charge pump to greater than 0.5V. The switch S1 is disabled (e.g., open) during normal operation, which allows VDDO to be driven to the proper operating voltage.

Figure 3:
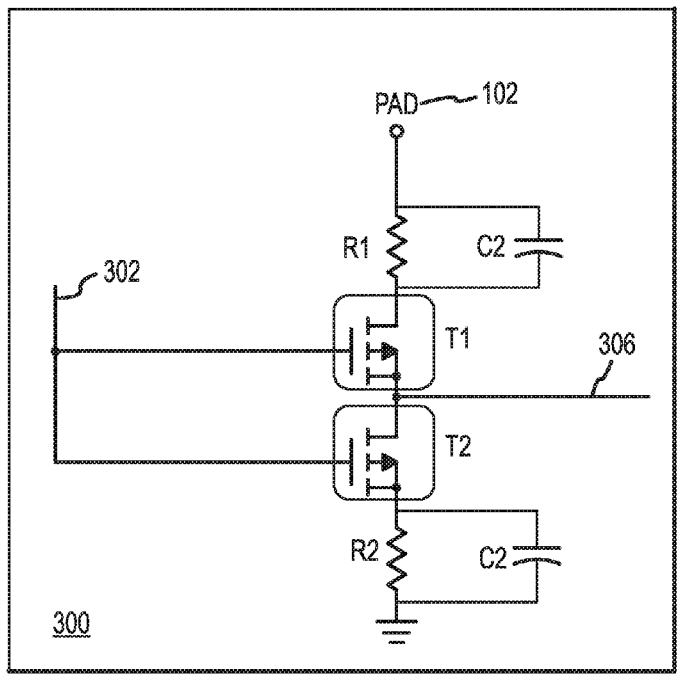
FIG. 3 illustrates an example of a voltage-divider circuit of the I/O interface circuit of FIG. 1B in accordance with one or more implementations.

FIG. 3 illustrates an example of a voltage-divider circuit 300 for the I/O interface circuit 110 of FIG. 1B in accordance with one or more implementations of the subject technology. The voltage-divider circuit 300 is similar to the voltage-divider 210 of FIG. 2A, except for the additional switches (e.g., PMOS transistors) T1 and T2. Switches T1 and T2 are disabled (e.g., turned off) by a signal 302 (e.g., fail-safe detection signal 232 generated by the fail-safe detection logic circuit 230 of FIG. 2A) going to the VDDO voltage, during the normal operation of the I/O interface circuit 200C of FIG. 2A. Whereas, during a fail-safe operation, the signal 302 enables (e.g., turns on) the PMOS transistors T1 and T2, which allows the voltage-divider circuit 300 to operate in a fail-safe mode of operation. During the fail-safe mode of operation, the output voltage 306 of the voltage-divider circuit 300 is a percentage (e.g., ~50%) of the input signal voltage at the pad 102, which is provided to the D0 input of the MUX 220 of FIG. 2A.

Figure 4:
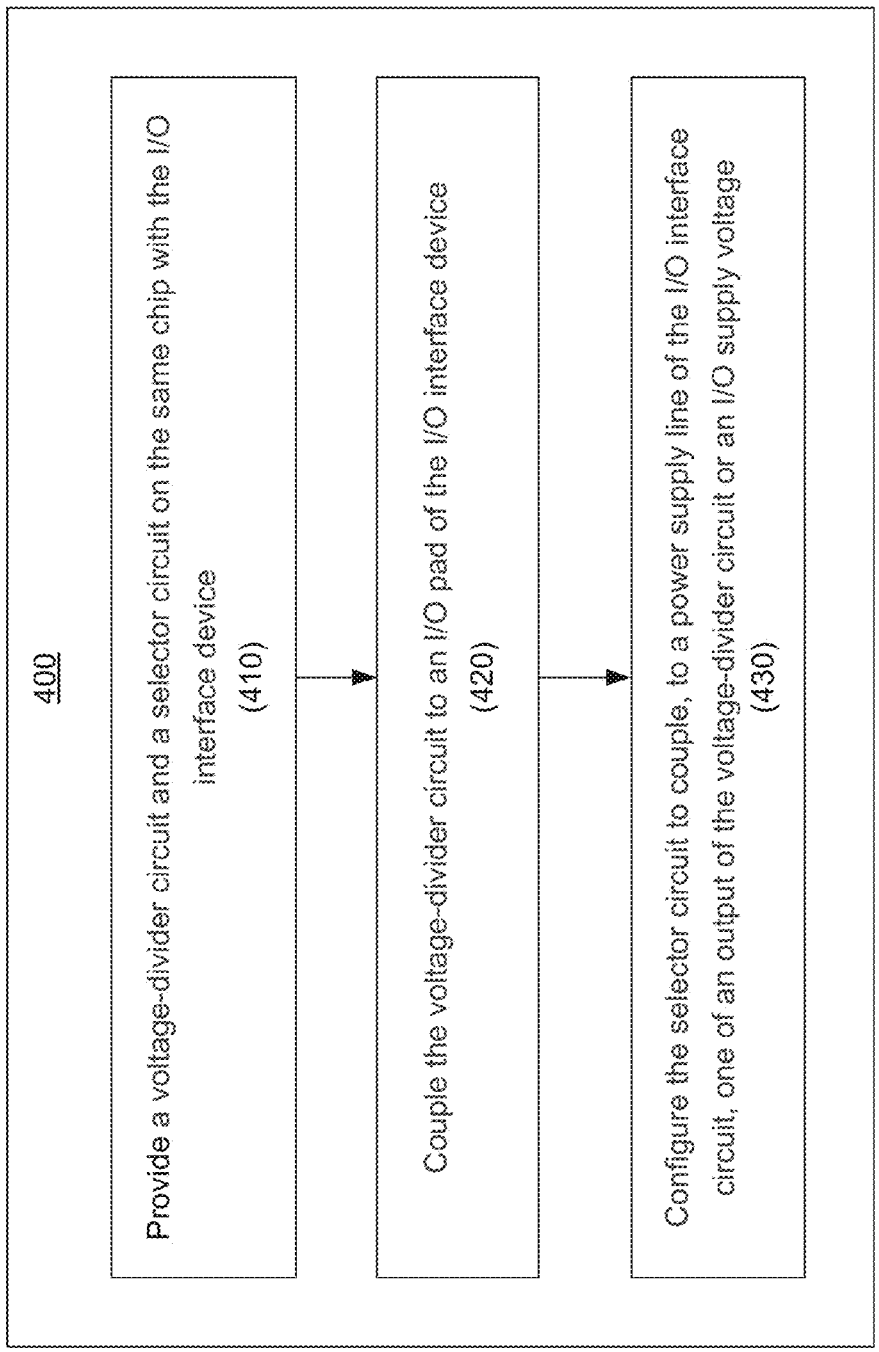
FIG. 4 illustrates an example of a method for providing a high-voltage fail-safe I/O interface circuit in accordance with one or more implementations.

FIG. 4 illustrates an example of a method 400 tor providing a high-voltage fail-safe I/O Interface circuit in accordance with one or more implementations of the subject technology. For explanatory purposes, the blocks of the example method 400 are described herein as occurring in serial, or linearly. However, multiple blocks of the example method 400 can occur in parallel. In addition, the blocks of the example method 400 need not be performed in the order shown and/or one or more of the blocks of the example method 400 need not be performed.

The method 400 includes providing a voltage-divider circuit (e.g., 140 of FIG. 1B or 210 of FIG. 2A) and a selector circuit (e.g., 130 of FIG. 1B or 220 of FIG. 2) on the same chip (e.g., 100 of FIG. 1A) with the I/O interface circuit (e.g., 110 of FIG. 1A or 1B) (410). The voltage-divider circuit is coupled to an I/O pad (e.g., 102 of FIG. 1B) of the I/O interface circuit (420). The selector circuit is configured to couple, to a power supply line (e.g., 116 of FIG. 1B) of the I/O interface circuit, one of an output of the voltage-divider circuit (e.g., 212 of FIG. 2A) or an I/O supply voltage (e.g., 225 of FIG. 2A) (430).

Figure 5:
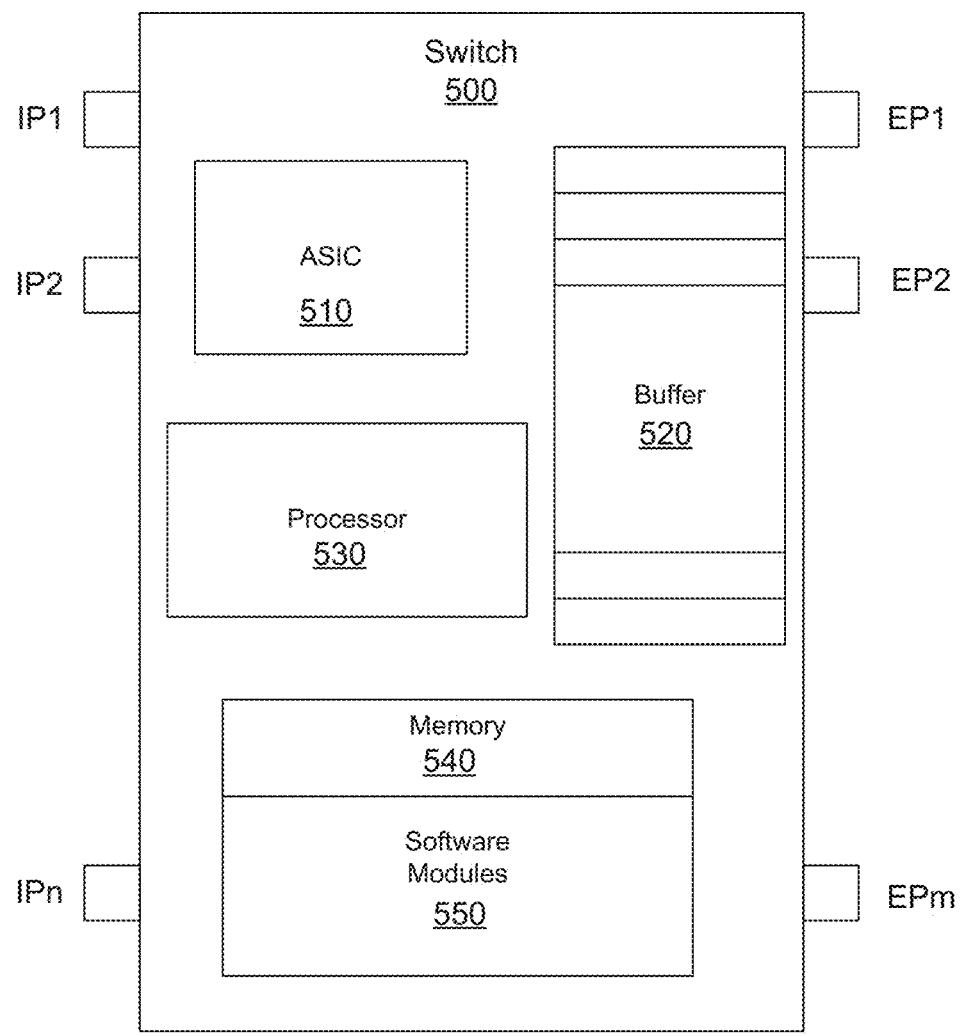
FIG. 5 illustrates an example of a communication device employing features of the subject technology for providing a high-voltage fail-safe I/O interface circuit in accordance with one or more implementations.

FIG. 5 illustrates an example of a communication device 500 employing features of the subject technology for providing a high-voltage fail-safe I/O interface circuit in accordance with one or more implementations of the subject technology.

Examples of the communication device 500 includes an Ethernet switch of an Ethernet network such as a private network including a data-center network, an enterprise network, or other private networks. The communication device 500 includes a number of ingress (input) ports IP1-IPn and multiple egress (output) ports EP1-EPm. In one or more implementations, one or more of the ingress ports IP1-IPn can receive a data packet from another switch or and endpoint device of the network. The communication device 500 further includes a hardware component such as an application specific integrated circuit (ASIC) 510 (which in some embodiments can be implemented as a field-programmable logic array (FPGA)), a buffer 520, a processor 530, memory 540, and a software module 550.

In some implementations, the ASIC 510 can include suitable logic, circuitry, interfaces and/or code that can be operable to perform functionalities of a PHY circuit. The buffer 520 includes suitable logic, circuitry, code and/or interfaces that are operable to receive and store and/or delay a block of data for communication through one or more of the egress ports EP1-EPm. The processor 530 includes suitable logic, circuitry, and/or code that can enable processing data and/or controlling operations of the communication device 500. In this regard, the processor 530 can be enabled to provide control signals to various other portions of the communication device 500. The processor 530 also controls transfers of data between various portions of the communication device 500. Additionally, the processor 530 can enable implementation of an operating system or otherwise execute code to manage operations of the communication device 500.

The memory 540 includes suitable logic, circuitry, and/or code that can enable storage of various types of information such as received data, generated data, code, and/or configuration information. The memory 540 includes, for example RAM, ROM, flash, and/or magnetic storage. In various embodiment of the subject technology, the memory 540 may include a RAM, DRAM, SRAM, T-RAM, Z-RAM, TTRAM, or any other storage media. The memory 540 can include software modules 550 that when executed by a processor (e.g., processor 530) can perform some or all of the functionalities of the ASIC 510. In some implementations, the software modules 550 include codes that when executed by a processor can perform functionalities such as configuration of the communication device 500.

In some implementations, the ingress ports IP1-IPn and the egress ports EP1-EPm of the communication device 500 may be implemented as pads 102 of FIG. 1A, each associated with an I/O interface circuit (e.g., 110 of FIG. 1A). The I/O interface circuit uses the features of the subject technology, as discussed above, to permit a high-voltage fail-safe operation of the I/O interface circuits of the ingress ports IP1-IPn and the egress ports EP1-EPm.

Those of skill in the art would appreciate that the various illustrative blocks modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or " each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An input/output (I/O) interface circuit, the circuit comprising:
    a voltage-divider circuit coupled to an I/O pad of the I/O interface circuit; and
    a selector circuit comprising a multiplexer configured to select one of an output of the voltage-divider circuit or an I/O supply voltage based on a fail-safe detection signal, wherein:
    the voltage-divider circuit and the selector circuit are implemented on the same chip as the I/O interface circuit.

2. The circuit of claim 1, wherein the supply voltage comprises a high supply voltage and is used to generate a lower supply voltage, wherein the lower supply voltage is larger than a core supply voltage.

3. The circuit of claim 1, further comprising a fail-safe detection logic circuit, wherein the fail-safe detection logic circuit is configured to generate the fail-safe detection signal based on the I/O supply voltage not being available.

4. The circuit of claim 1, wherein the voltage-divider circuit is configured to generate a voltage that is a percentage of a magnitude of an input signal coupled to the I/O pad.

5. The circuit of claim 1, further comprising an internal clamp circuit configured to clamp the I/O supply voltage to a low voltage to prevent voltage overstresses on the I/O interface circuit during a fail-safe mode of operation.

6. The circuit of claim 5, wherein the internal clamp circuit is configured to clamp the I/O supply voltage to a lower voltage based on a fail-safe detection signal.

7. The circuit of claim 6, wherein the fail-safe detection signal is generated based on the I/O supply voltage not being available.

8. The circuit of claim 5, wherein the internal clamp circuit comprises a switch controllable by the fail-safe detection signal.

9. The circuit of claim 1, wherein the voltage-divider circuit includes one or more switches that are configurable to disable the voltage-divider circuit based on a fail-safe detection signal, wherein the fail-safe detection signal is generated based on the I/O supply voltage not being available.

10. A method for providing an input/output (I/O) interface circuit, the method comprising:
    providing a voltage-divider circuit and a selector circuit comprising a multiplexer on a same chip with the I/O interface circuit;
    coupling the voltage-divider circuit to an I/O pad of the I/O interface circuit; and
    configuring the multiplexer to select one of an output of the voltage-divider circuit or an I/O supply voltage based on a fail-safe detection signal.

11. The method of claim 10, wherein the I/O supply voltage comprises a high supply voltage, wherein the method comprises using the high supply voltage to generate a lower supply voltage, and wherein the lower supply voltage is larger than a core supply voltage.

12. The method of claim 10, further comprising configuring a fail-safe detection logic circuit to generate the fail-safe detection signal based on the I/O supply voltage not being available.

13. The method of claim 10, further comprising configuring the voltage-divider circuit to generate a voltage that is a percentage of a magnitude of an input signal coupled to the I/O pad.

14. The method of claim 10, further comprising configuring an internal clamp circuit to prevent overvoltage stresses on the I/O interface circuit during a fail-safe mode of operation by clamping the I/O supply voltage to a low voltage.

15. The method of claim 14, wherein configuring the internal clamp circuit to prevent voltage overstresses on the I/O interface circuit during the fail-safe mode of operation comprises clamping the I/O supply voltage to a lower voltage based on a fail-safe detection signal.

16. The method of claim 14, further comprising providing the internal clamp circuit by using a switch controllable by the fail-safe detection signal and generating the fail-safe detection signal based on the I/O supply voltage not being available.

17. The method of claim 10, wherein providing the voltage-divider comprises providing one or more switches.

18. The circuit of claim 10, further comprising configuring the one or more switches to disable the divider circuit based on a fail-safe detection signal and generating the fail-safe detection signal based on the I/O supply voltage not being available.

19. A chip comprising:
    one or more I/O pads;
    one or more I/O interface circuits, each of the one or more I/O interface circuits coupled to at least one of the one or more I/O pads and comprising:
        a voltage-divider circuit coupled to a corresponding I/O pad of the respective I/O interface circuit; and
        a selector circuit comprising a multiplexer configured to select one of an output of the voltage-divider circuit or an I/O supply voltage based on a fail-safe detection signal.

20. The chip of claim 19, wherein:
    the I/O supply voltage comprises a high supply voltage and is used to generate a lower supply voltage, wherein the lower supply voltage is larger than a core supply voltage, and
    the voltage-divider circuit includes one or more switches that are configurable to disable the voltage-divider circuit based on a fail-safe detection signal, wherein the fail-safe detection signal is generated based on the I/O supply voltage not being available.

* * * * *